(12) United States Patent
Woo et al.

(10) Patent No.: US 11,543,475 B2
(45) Date of Patent: Jan. 3, 2023

(54) ANTENNA APPARATUS INCLUDING HIGH PERMITTIVITY MATERIALS (HPM) FOR RADIO FREQUENCY (RF) COILS

(71) Applicant: REGENTS OF THE UNIVERSITY OF MINNESOTA, Minneapolis, MN (US)

(72) Inventors: Myung Kyun Woo, Minneapolis, MN (US); Gregor Adriany, Minneapolis, MN (US); Kamil Ugurbil, Minneapolis, MN (US); Russell L. Lagore, Minneapolis, MN (US); Lance DelaBarre, Minneapolis, MN (US); Jerahmie Radder, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 72 days.

(21) Appl. No.: 16/859,771

(22) Filed: Apr. 27, 2020

(65) Prior Publication Data

US 2020/0341082 A1 Oct. 29, 2020

Related U.S. Application Data

(60) Provisional application No. 62/838,643, filed on Apr. 25, 2019.

(51) Int. Cl.
*G01R 33/28* (2006.01)
*H01Q 7/00* (2006.01)
(Continued)

(52) U.S. Cl.
CPC ......... *G01R 33/288* (2013.01); *G01R 33/341* (2013.01); *H01Q 1/36* (2013.01); *H01Q 7/00* (2013.01); *H01Q 21/29* (2013.01)

(58) Field of Classification Search
None
See application file for complete search history.

(56) References Cited

U.S. PATENT DOCUMENTS

| | | | | |
|---|---|---|---|---|
| 5,017,872 A | * | 5/1991 | Foo | G01R 33/422 324/318 |
| 2011/0152670 A1 | | 6/2011 | Yang | |
| 2020/0292647 A1 | * | 9/2020 | Notaros | G01R 33/345 |

FOREIGN PATENT DOCUMENTS

| | | | |
|---|---|---|---|
| EP | 2669697 A2 * | 12/2013 | ............. G01R 33/32 |
| EP | 3096153 A1 | 11/2016 | |
| WO | 2011096982 A1 | 8/2011 | |

OTHER PUBLICATIONS

Beck BL, et al. Tissue-equivalent phantoms for high frequencies. Concepts Magn. Reson. 2004;20B:30-33.
(Continued)

*Primary Examiner* — Douglas X Rodriguez
(74) *Attorney, Agent, or Firm* — Quarles & Brady LLP

(57) ABSTRACT

An antenna apparatus for a radio frequency (RF) coil to transmit signals to and to receive signal from a subject in a magnetic resonance imaging (MRI) system includes a distal surface facing away from the subject, a proximal surface facing towards the subject, a high permittivity material (HPM) having a shape, and an antenna coupled to the HPM and positioned on the proximal surface such that the antenna is positioned between the HPM and the subject.

19 Claims, 14 Drawing Sheets
(8 of 14 Drawing Sheet(s) Filed in Color)

(51) Int. Cl.
  *G01R 33/341* (2006.01)
  *H01Q 1/36* (2006.01)
  *H01Q 21/29* (2006.01)

(56) References Cited

OTHER PUBLICATIONS

Haines, K., et al. "High Q calcium titanate cylindrical dielectric resonators for magnetic resonance microimaging." Journal of Magnetic Resonance 200.2 (2009): 349-353.

Lagore, R. L., et al. "High dielectric constant (HDC) disk dipoles for 10.5 T imaging." Proceedings of the 25th Annual Meeting of ISMRM, Honolulu, HI. 2017. p. 1128.

Luo, W., et al. 2017. Effect of porosity and microstructure on the microwave dielectric properties of rutile. Materials Letters, 200, pp. 101-104.

Neuberger, T., et al. "Design of a ceramic dielectric resonator for NMR microimaging at 14.1 tesla." Concepts in Magnetic Resonance Part B: Magnetic Resonance Engineering: An Educational Journal 33.2 (2008): 109-114.

Webb, A. G. "Dielectric materials in magnetic resonance." Concepts in magnetic resonance part A 38.4 (2011): 148-184.

Woo, M.K. et al. Comparison of a 16-channel monopole/dipole hybrid array with a combined 8-channel monopole + 8-channel high dielectric constant (HDC) disk dipole array for head imaging at 10.5T. In proceedings of the 26th Annual Meeting of ISMRM, Paris, 2018. 0024.

Yang, Q. X., et al. "Manipulation of image intensity distribution at 7.0 T: passive RF shimming and focusing with dielectric materials." Journal of Magnetic Resonance Imaging 24.1 (2006): 197-202.

Zhang, B., et al. "Evaluating the SNR performance of using dielectric pads with multiple channel RF coils at 7T." Proceedings of the 16th Annual Meeting of ISMRM, Toronto. 2015.

Zhang, B., et al. "29-channel receive-only dense dipole head array for 7T MRI" 2017 International Conference on Electromagnetics in Advanced Applications (ICEAA). IEEE, 2017. p. 4314.

* cited by examiner

ANTENNA APPARATUS INCLUDING HIGH PERMITTIVITY MATERIALS (HPM) FOR RADIO FREQUENCY (RF) COILS

CROSS-REFERENCE TO RELATED APPLICATION

This application is based on, claims priority to, and incorporates herein by reference in its entirety U.S. Ser. No. 62/838,643 filed Apr. 25, 2019, and entitled "Antenna Apparatus Including High Permittivity Materials (HPM) For Radio Frequency (RF) Coils."

STATEMENT REGARDING FEDERALLY SPONSORED RESEARCH

This invention was made with government support under EB025144, RR026783, EB015894 and NS076408 awarded by the National Institutes of Health. The government has certain rights in the invention.

BACKGROUND

High permittivity materials (HPM) (or High Dielectric Material or High Dielectric Constant (HDC) Material) have been adapted for use in magnetic resonance imaging (MRI) including ultra-high field (UHF) applications. HPMs may be used to improve signal-to-noise ratio (SNR), transmit $B_1$ efficiency, and $B_1$ field uniformity. HPMs may be incorporated in, for example, radio frequency (RF) coils in an MRI system. Typically, HPMs are positioned between a subject and the RF coil. For example an HPM positioned around the human head, spine or other body part during an MRI scan can improve image SNR and resolution or reduce scan time, and also reducing RF energy deposition or specific absorption rate (SAR) to make MRI safer.

SUMMARY OF THE DISCLOSURE

In accordance with an embodiment, an antenna apparatus for a radio frequency (RF) coil to transmit signals to and to receive signal from a subject in a magnetic resonance imaging (MRI) system includes a distal surface facing away from the subject, a proximal surface facing towards the subject, a high permittivity material (HPM) having a shape, and an antenna coupled to the HPM and positioned on the proximal surface such that the antenna is positioned between the HPM and the subject.

In accordance with another embodiment, a magnetic resonance imaging (MRI) system includes a magnet system configured to generate a polarizing magnetic field about at least a portion of a subject, a magnetic gradient system including a plurality of magnetic gradient coils configured to apply at least one magnetic gradient field to the polarizing magnetic field and a radio frequency (RF) system configured to apply an RF field to the subject and to receive magnetic resonance signals from the subject using at least one RF coil. The at least one RF coil includes at least one antenna apparatus. The antenna apparatus includes a distal surface facing away from the subject, a proximal surface facing towards the subject, a high permittivity material (HPM) having a shape and an antenna coupled to the HPM and positioned on the proximal surface such that the antenna is positioned between the HPM and the subject.

BRIEF DESCRIPTION OF THE DRAWINGS

The patent or patent application file contains at least one drawing in color. Copies of this patent or patent application publication with color drawings will be provided by the office upon request and payment of the necessary fee. The present invention will hereafter be described with reference to the accompanying drawings, wherein like reference numerals denote like elements.

DETAILED DESCRIPTION

Figure 1:
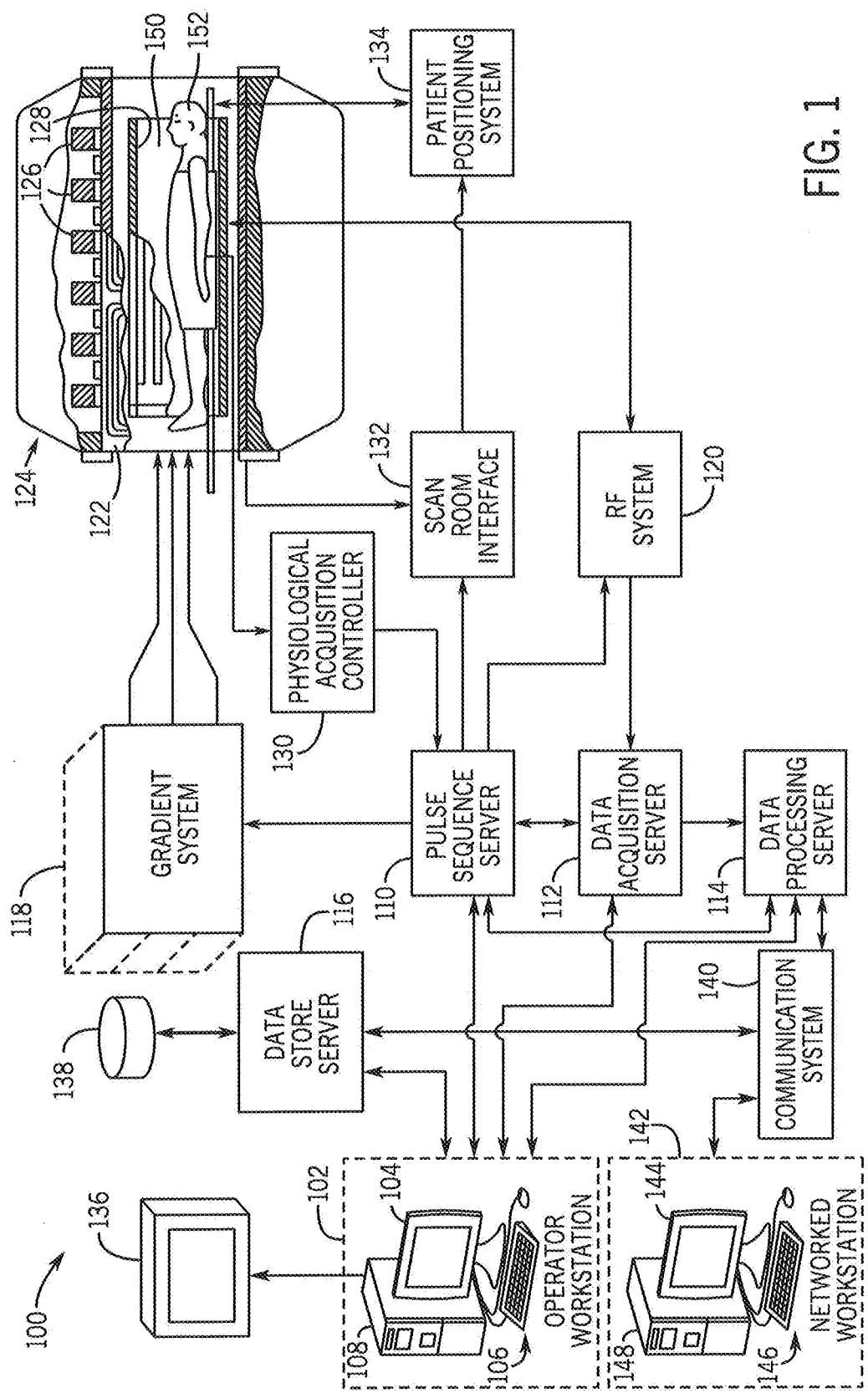
FIG. 1 is a schematic diagram of an example MRI system in accordance with an embodiment.

FIG. 1 shows an example of an MRI system 100. MRI system 100 includes an operator workstation 102, which may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

Figure 2:
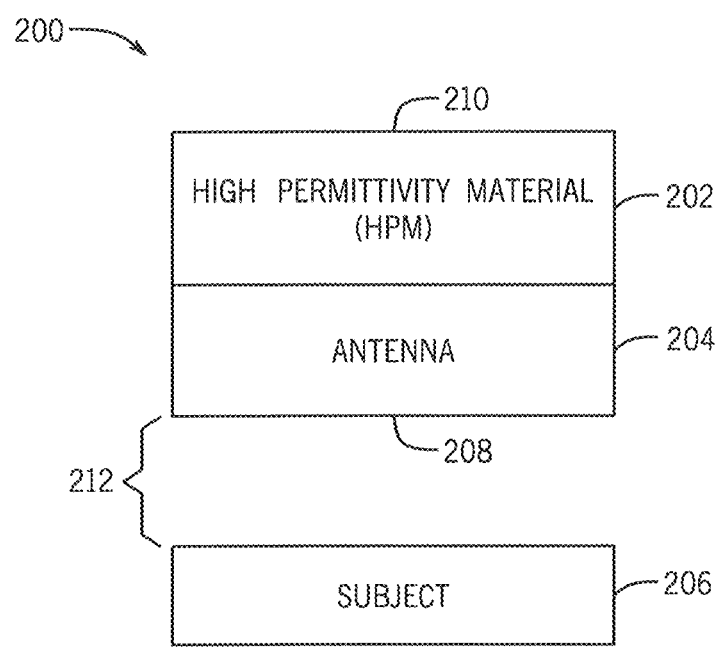
FIG. 2 is a block diagram of an antenna apparatus in accordance with an embodiment.

As mentioned, the magnet assembly 124 includes an RF coil 128 that may be used to transmit and/or receive MR signals. In FIG. 1, RF coil 128 is cylindrical in shape and surrounds an imaging volume 150 within a patient bore tube (not shown). A subject (e.g., a patient or object) 152 is positioned within the imaging volume 150. While the embodiment shown in FIG. 1 shows a cylindrical RF coil 128, it should be understood that other topologies than cylindrical assemblies may be used. As used herein, the direction proximal is the direction toward the subject and the direction distal is the direction away from the subject. The present disclosure describes an antenna apparatus including high permittivity material (HPM) (or High Dielectric Material or High Dielectric Constant (HDC) Material) for an RF coil. FIG. 2 is a block diagram of an antenna apparatus in accordance with an embodiment. In FIG. 2, an antenna apparatus 200 includes a HPM 202 and an antenna 204. The antenna apparatus 200 has a proximal surface 208 and a distal surface 210. The proximal surface 208 of the antenna apparatus 200 is positioned at a distance 212 from the subject 206. The HPM 202 may be formed in a shape, for example, a disk, one or more rectangular blocks, or a cylinder. The HPM may be a high permittivity material, such as, for example, $TiO_2$, $BaTiO_3$, $CaTiO_3$, $BaTi_4O_9$, etc. In an embodiment, the antenna 204 is positioned directly on the HPM 202. In another embodiment, the antenna 204 is positioned in close proximity to the HPM 202. The antenna apparatus 200 may be used in applications at various field strengths, for example, 3T and ultra-high fields (UHF) 7T and 10.5T. The shape, size, location and permittivity of the HPM 202 and the antenna apparatus 200 may be optimized for specific applications.

The proximal surface 208 of the antenna apparatus 200 is positioned so that the antenna 204 is located between the HPM 202 and a subject 206 in an imaging volume (e.g., imaging volume 150 shown in FIG. 1). In other words, the proximal surface 208 and the antenna 204 face the subject 206 and the distal surface 210 and the HPM 202 face away from the subject 206. In an embodiment, one or more of the antenna apparatus 200 may be positioned around the imaging volume, for example, as part of RF coil 128 (shown in FIG. 1). In one embodiment, a plurality of antenna apparatus 200 may be used in a transmit array for an MRI system including UHF MRI systems. In an embodiment, a plurality of antenna apparatus 200 may be used in a body array. In another embodiment, an MRI system may include a layered combination of HPMs where two or more RF coils in the MRI system include an antenna apparatus with HPM facing away from a subject. For example, an RF transmit coil and a separate RF receive coil (e.g., an RF receive only coil that is part of an RF receive coil array) may each include an antenna apparatus 200 with HPM in the flipped configuration. Positioning the antenna 204 between the HPM 202 and the subject 206 improves the performance of the antenna apparatus 200 or an RF coil including the antenna apparatus 200 for both transmitting and receiving signals. The counterintuitive "flipped" configuration of the antenna apparatus 200 improves $B_1^+$ efficiency of the antenna apparatus 200. Accordingly, antenna apparatus 200 may be used to provide a more efficient RF transmitter as well as a more efficient RF receiver.

Figure 3B:
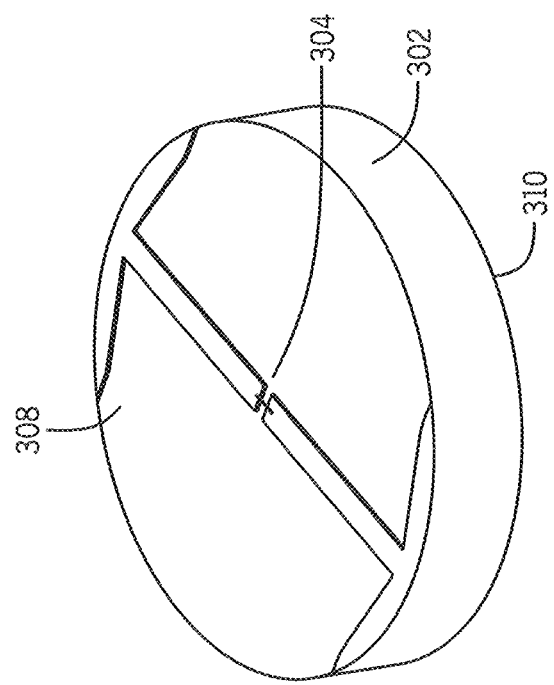
FIG. 3B is a perspective view of a proximal surface of the example antenna apparatus of FIG. 3A in accordance with an embodiment.
Figure 3A:
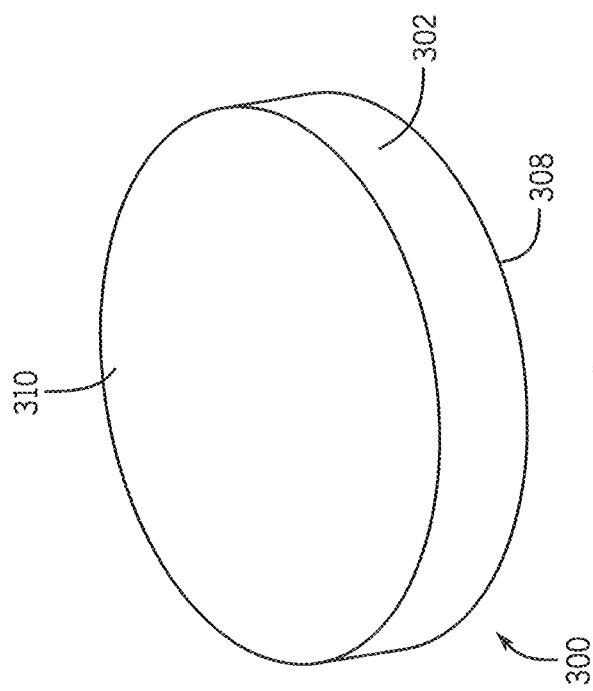
FIG. 3A shows a perspective view of a distal surface of an example antenna apparatus having a disk shape and an end-loaded dipole antenna in accordance with an embodiment.
Figure 4:
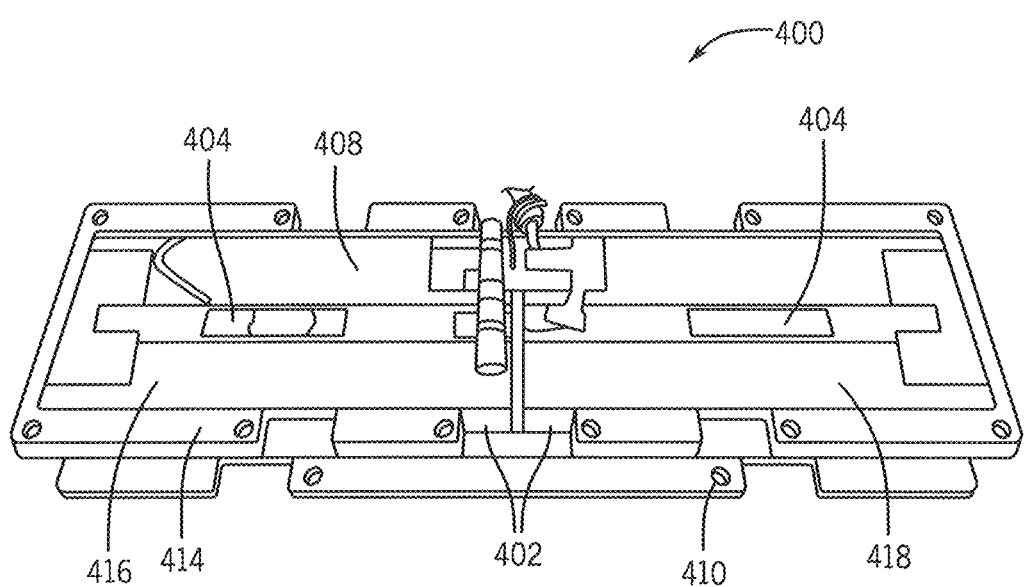
FIG. 4 is a perspective view of a proximal surface an example antenna apparatus having a rectangular shape and an end-loaded dipole antenna in accordance with an embodiment.
Figure 5:
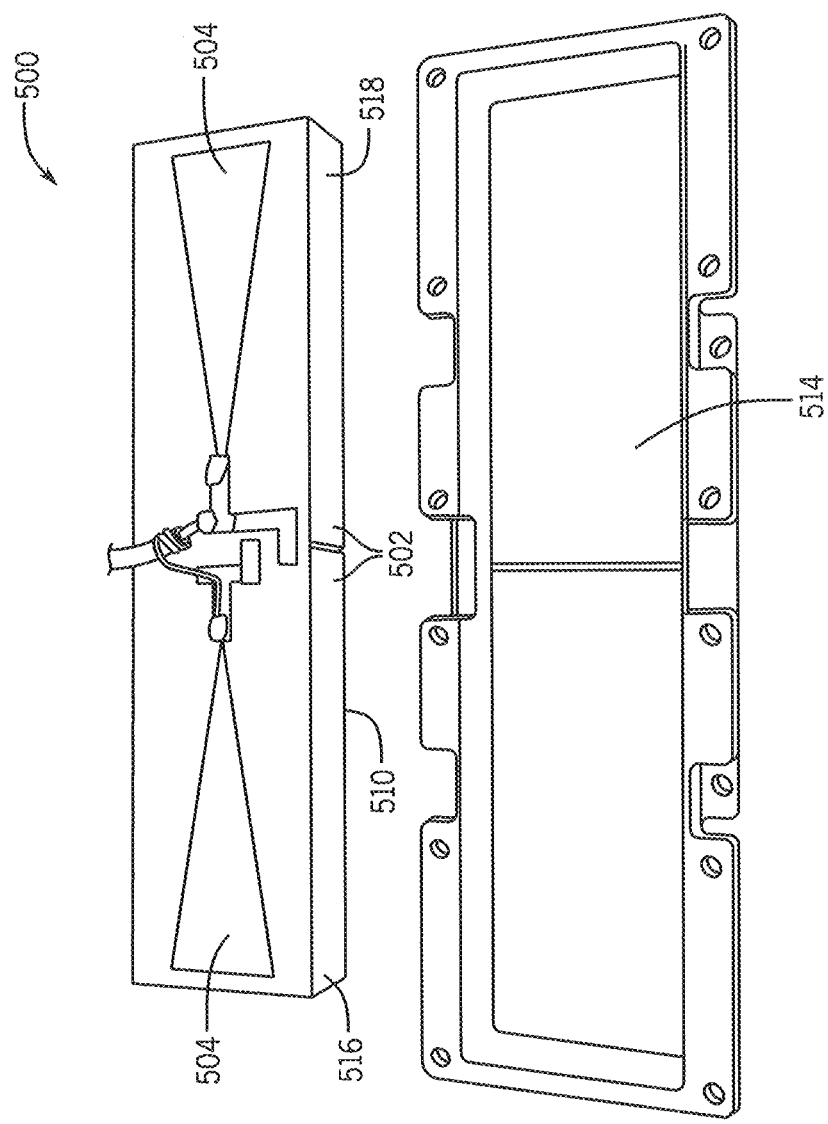
FIG. 5 is a perspective view of a proximal surface of an example antenna apparatus having a rectangular shape and a "bowtie" antenna in accordance with an embodiment.

The antenna 204 may be a known antenna type such as, for example, a dipole antenna, an end-loaded dipole antenna, or a "bowtie" antenna. In addition, as mentioned, the HPM 202 may be formed in a shape, for example a disk or rectangular block. FIG. 3A shows a perspective view of a distal surface of an example antenna apparatus having a disk shape and an end-loaded dipole antenna in accordance with an embodiment and FIG. 3B is a perspective view of a proximal surface of the example antenna apparatus of FIG. 3A in accordance with an embodiment. In FIG. 3A, the antenna apparatus 200 has a proximal surface 308 and a distal surface 310. The antenna apparatus 300 includes high permittivity material (HPM) 302 formed in the shape of a disk. An antenna 304 is positioned on the proximal surface 308 on the HPM 302 as shown in FIG. 3B. In this embodiment, the antenna 304 is an end-loaded dipole antenna. As mentioned above, the antenna 304 may be positioned directly on the HPM 302 or may be positioned in close proximity to the HPM 302. FIG. 4 is a perspective view of a proximal surface an example antenna apparatus having a rectangular shape and an end-loaded dipole antenna in accordance with an embodiment. In FIG. 4, the antenna apparatus 400 has a proximal surface 408 and a distal surface 410. The antenna apparatus 400 includes high permittivity material (HPM) 402 formed in the shape of a first rectangular block 416 and a second rectangular block 418. The HPM blocks 416 and 418 are positioned in an antenna former 414. An antenna 404 is positioned on the proximal surface 408 on each block 416, 418 of the HPM 402. In this embodiment, the antenna 404 is an end-loaded dipole antenna. As mentioned above, the antenna 404 may be positioned directly on the HPM 402 or may be positioned in close proximity to the HPM 402. FIG. 5 is a perspective view of a proximal surface of an example antenna apparatus having a rectangular shape and a "bowtie" antenna in accordance with an embodiment. In FIG. 5, the antenna apparatus 500 has a proximal surface 508 and a distal surface 510. The antenna apparatus 500 includes high permittivity material (HPM) 502 formed in the shape of a first rectangular block 516 and a second rectangular block 518. The HPM blocks 516 and 518 may be positioned in an antenna former 514. An antenna 504 is positioned on the proximal surface 508 on each block 516, 518 of the HPM 502. In this embodiment, the antenna 504 is a "bowtie" antenna. As mentioned above, the antenna 504 may be positioned directly on the HPM 502 or may be positioned in close proximity to the HPM 502.

The following examples set forth, in detail, ways in which the present disclosure was evaluated and ways in which the present disclosure may be used or implemented and will enable one of ordinary skill in the art to more readily understand the principles thereof. The following examples are presented by way of illustration and are not meant to be limiting in any way.

Figure 6:
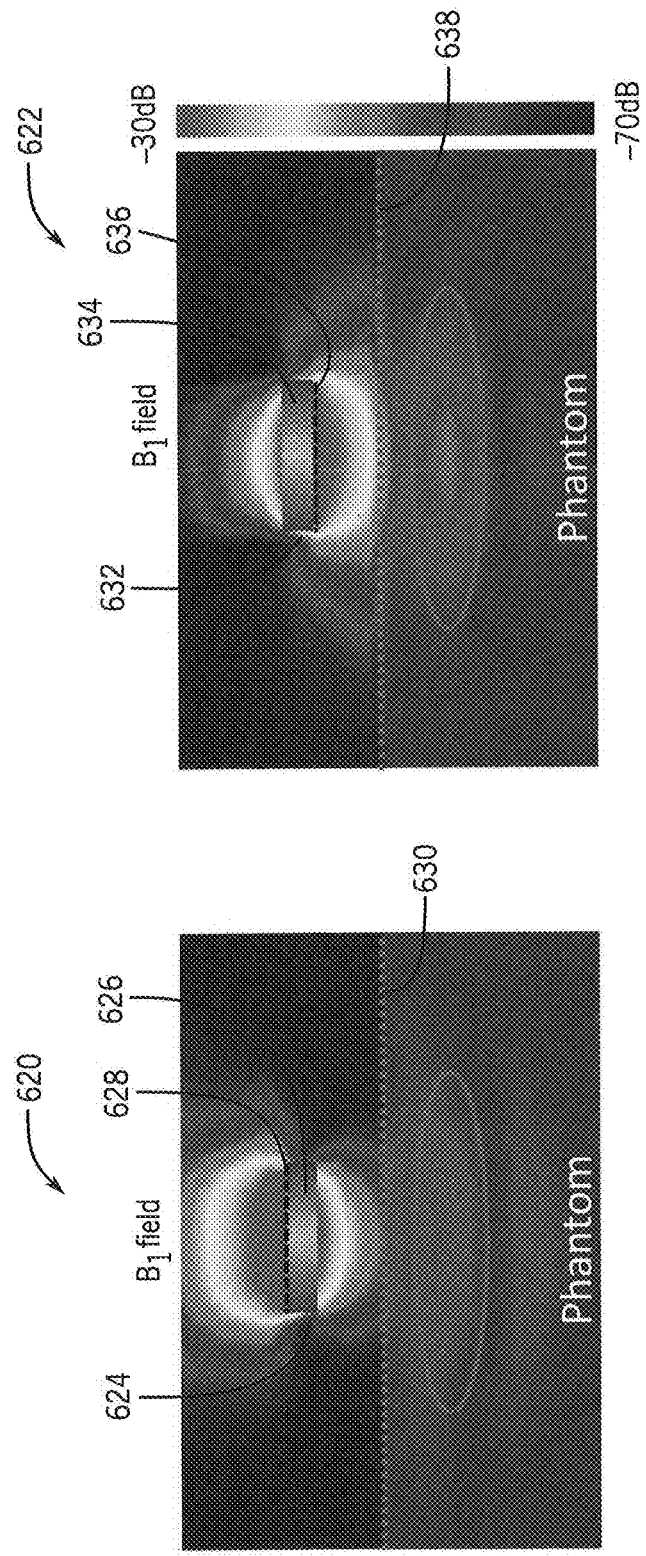
FIG. 6 shows a comparison of $B_1$ field patterns of a disk shaped "flipped" configuration and a disk shaped conventional "non-flipped" configuration in accordance with an embodiment.

In various examples, the operation and performance of the "flipped" geometry antenna apparatus 200 (shown in FIG. 2) was evaluated and compared to conventional "non-flipped" geometries. FIG. 6 shows a comparison of $B_1$ field patterns of a disk shaped "flipped" configuration and a disk shaped conventional "non-flipped" configuration. In FIG. 6, the HPM (in this example, $\sigma=0.0031$ S/m and $\varepsilon_r=100$) material 626, 634 for both the conventional geometry 624 and flipped antenna apparatus geometry 632 is formed as a flat disk (e.g., 8.2 cm diameter and 1.6 cm thick). In addition, an end-loaded dipole antenna 628 is attached to the HPM 626 on a distal surface in the conventional non-flipped configuration 624. An end-loaded dipole antenna 636 is attached to the HPM 634 on a proximal surface in the flipped configuration 632. In this example, the end-loaded dipole antennas 628, 636 were built directly onto the HPM 626,634 using one variable capacitor. In the $B_1$ field patterns 620, 622, the dotted lines 630, 638 indicate the edge of the phantom (or subject). $B_1^+$ fields were obtained using an actual flip angle imaging (AFI) sequence for a cylindrical phantom (e.g., 17 cm diameter and 30.5 cm long) with uniform electrical properties ($\sigma$=0.6 S/m and Cr=49) at 10.5T. $B_1^+$ fields were normalized to 1 W for $B_1^+$ efficiency ($\mu T/\sqrt{W}$).

Figure 7:
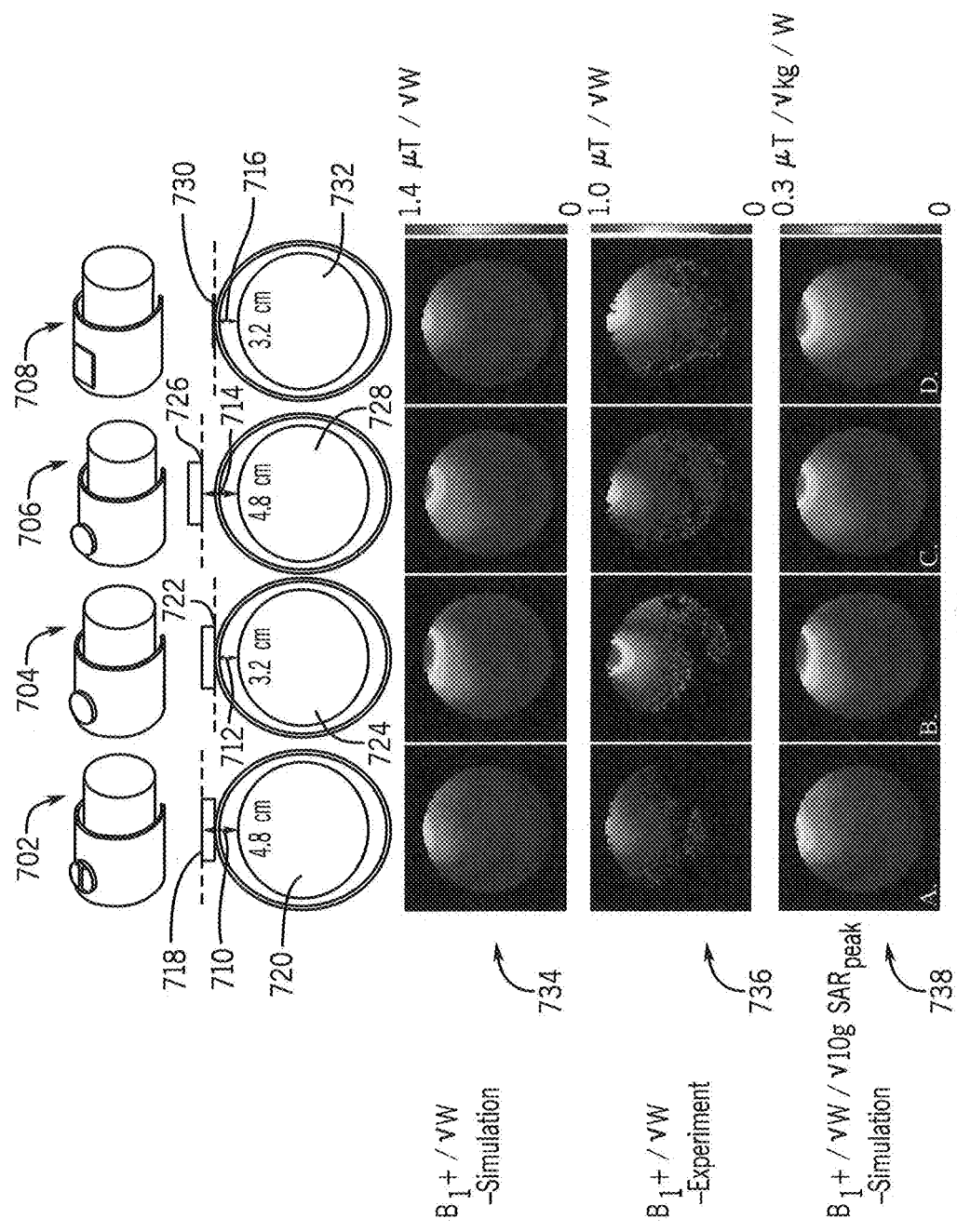
FIG. 7 shows example $B_1^+$ efficiency results for disk shaped "flipped" configurations compared to example $B_1^+$ efficiency results for a disk shaped conventional "non-flipped" configuration in accordance with an embodiment.

FIG. 7 shows example $B_1^+$ efficiency results for disk shaped "flipped" configurations compared to example $B_1^+$ efficiency results for a disk shaped conventional "non-flipped" configuration. In this example, the performance of 10.5T RF coils composed of antenna apparatus 200 (shown in FIG. 2) with dipole antennas and high permittivity ceramic materials placed in close proximity to the dipole antenna were evaluated. In particular, the impact of the location of the HPM relative to the dipole antenna was evaluated. In this example, the $B_1^+$ efficiency of the conventional "non-flipped" configuration with the HPM positioned between the subject and the antenna was compared with the "flipped" configuration 200 (shown in FIG. 2). The comparison included arrangements where both the flipped and the conventional non-flipped configurations had the same distance between the dipole antenna and the subject as well as a geometry where the dipole antenna was placed close to the subject. In addition, the non-flipped and flipped HPM dipole antenna configurations were compared to an inductively shortened dipole antenna apparatus of the same length. All three configurations were compared in terms of $B_1^+$ efficiency relative to RF power used ($B_1^+/\sqrt{W}$) and relative to SAR ($B_1^+/\sqrt{W}/\sqrt{10}$ g $SAR_{peak}$) and verified at 10.5T.

In the example of FIG. 7, $B_1^+$ efficiency ($B_1^+/\sqrt{W}$) maps for both simulated 734 and experimental 736 results and $B_1^+$/SAR ($B_1^+/\sqrt{W}/\sqrt{10}$ g $SAR_{peak}$) maps 736 were compared for four configurations. The first configuration is a conventional non-flipped setup 702 where an end-loaded dipole antenna 718 is on a distal surface of a disk shaped HPM and the antenna 718 is a distance 710 (e.g., 4.8 cm) from a phantom (or subject) 720. The second configuration is a flipped setup 704 (e.g., antenna apparatus 200 shown in FIG. 2) where an end-loaded dipole antenna 722 on a proximal surface (relative to the subject) of a disk shaped HPM is a distance 712 (e.g., 3.2 cm) from the phantom (or subject) 724 that places the flipped setup antenna apparatus at the same location relative to the subject as the non-flipped setup 702. The third configuration is a flipped setup 706 where an end-loaded dipole antenna 726 on a proximal surface (relative to the subject) of a disk shaped HPM is a distance 714 (e.g., 4.8 cm) from the phantom (or subject 728) identical to the non-flipped setup 702. The fourth configuration is an inductor shortened dipole antenna 730 without HPM that was shortened to be the same length as the HPM dipole antenna by adding inductors at the feed-point. The inductor shortened dipole antenna 730 is a distance 716 (e.g., 3.2 cm) from the phantom (or subject) 732. The example simulated $B_1^+$ efficiency maps 734 and 10 g SAR maps ($B_1^+/\sqrt{W}/\sqrt{10}$ g $SAR_{peak}$ ($\mu T/\sqrt{kg}/W$)) 738 were calculated with 2×2×2 mm³ resolution. As mentioned, in this example the dipole antenna was either 3.2 or 4.8 cm away from the phantom for the various antenna configurations.

FIG. 7 also shows $B_1^+$ efficiency—Experiment ($\mu T/\sqrt{W}$) maps 736 for the conventional non-flipped configuration 702, the flipped configuration 704, the flipped configuration 706 maintaining the same distance between the dipole antenna and the subject as the non-flipped setup, and the inductor-shortened dipole antenna 708 without HPM that has the same dipole length as in the non-flipped and flipped configurations. Table 1 includes the highest point value of (i) the $B_1^+$ efficiency with the disk shaped HPM—Simulation ($\mu T/\sqrt{W}$) maps 734, (ii) the $B_1^+$ efficiency—Experiment ($\mu T/\sqrt{W}$) maps 736, and (iii) the $B_1^+/\sqrt{W}/\sqrt{10}$ g $SAR_{peak}$ ($\mu T/\sqrt{kg}/W$) maps 738 with the non-flipped configuration 702, the flipped configuration 704, the flipped configuration 706 maintaining the same distance between the dipole antenna and the subject as the non-flipped configuration, and the inductor-shortened dipole antenna 708 without HPM that has the same dipole length as in the non-flipped and flipped configurations.

TABLE 1

| Disk Shaped HPM | | | | |
|---|---|---|---|---|
| | Conventional HPM Dipole | Flipped HPM Dipole | Flipped (Same distance) | Inductor Shortened Dipole |
| $B_1^+/\sqrt{W}$ - Simulation ($\mu T/\sqrt{W}$) | 0.83 | 1.74 | 1.37 | 1.13 |
| $B_1^+/\sqrt{W}$ - Experiment ($\mu T/\sqrt{W}$) | 0.45 | 1.16 | 0.68 | 0.72 |
| $B_1^+/\sqrt{W}/\sqrt{10}$ g $SAR_{peak}$ ($\mu T/\sqrt{kg}/W$) | 0.24 | 0.38 | 0.33 | 0.32 |

In the example described above with respect to FIG. 7, the flipped configuration 704 shows substantially higher $B_1^+$ efficiency values compared to the non-flipped configuration 702 or an inductively shortened dipole 708 without HPM. When the distance between the dipole antenna and the phantom is kept the same as the non-flipped configuration 702, the flipped configuration 706 still shows an improvement. The flipped configuration also produced the highest performance of relative $B_1^+/\sqrt{W}/\sqrt{10}$ g $SAR_{peak}$.

Figure 8:
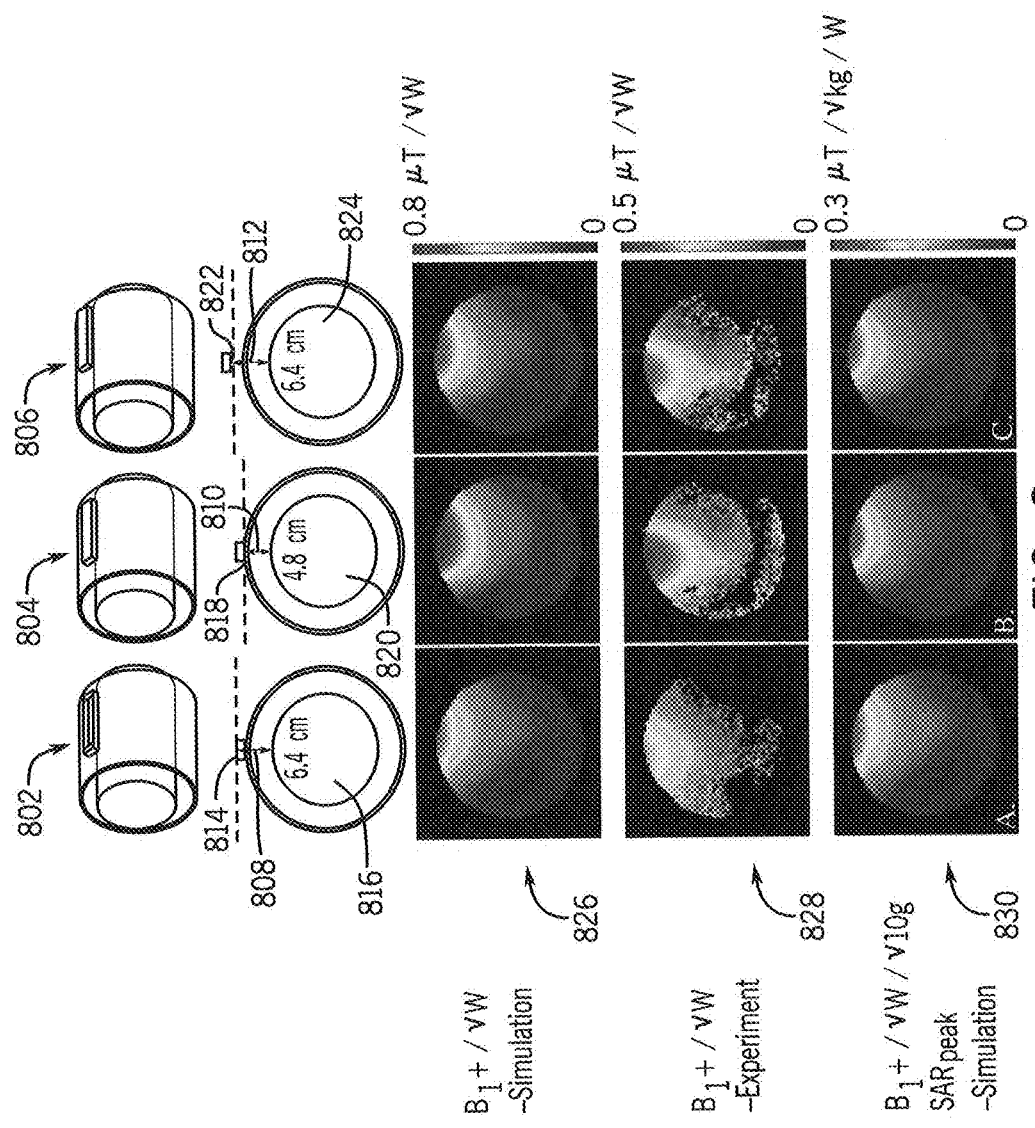
FIG. 8 shows example $B_1^+$ efficiency results for rectangular block shaped "flipped" configurations compared to example $B_1^+$ efficiency results for a rectangular block shaped conventional "non-flipped" configuration in accordance with an embodiment.

FIG. 8 shows example $B_1^+$ efficiency results for rectangular block shaped "flipped" configurations compared to example $B_1^+$ efficiency results for a rectangular block shaped conventional "non-flipped" configuration. In this example, the various configurations of an antenna apparatus (e.g., the HPM) was formed in rectangular shaped blocks as shown in FIG. 4 (e.g., 15 cm long box shape (two-3.2×7.5× 1.6 cm³ placed end to end)). The first configuration is a conventional non-flipped setup 802 where an end-loaded dipole antenna 814 is on a distal surface (relative to the subject) of the rectangular shaped HPM and the antenna 814 is a distance 808 (e.g., 6.4 cm) from a phantom (or subject) 816. The second configuration is a flipped setup 804 (e.g., antenna apparatus 200 shown in FIG. 2) where an end-loaded dipole antenna 818 on a proximal surface (relative to the subject) of a rectangular shaped HPM is a distance 810 (e.g., 4.8 cm) from the phantom (or subject) 820 that places the flipped setup antenna apparatus at the same location relative to the subject as the non-flipped setup 802. The third configuration is a flipped setup 806 where an end-loaded dipole antenna 822 on a proximal surface of a rectangular shaped HPM is a distance 812 (e.g., 6.4 cm) from the phantom (or subject) 824 identical to the non-flipped setup

802. In this example, an end-loaded dipole was built directly onto the HPM using one variable capacitor. $B_1^+$ fields were obtained using an actual flip angle imaging (AFI) sequence for a cylindrical phantom (e.g., 17 cm diameter and 30.5 cm long) with uniform electrical properties ($\sigma=0.6$ S/m and $\varepsilon'=49$) at 10.5T. $B_1^+$ fields were normalized to 1 W for $B_1^+$ efficiency ($\mu T/\sqrt{W}$).

As mentioned, in this example, the rectangular block dipole antenna was located either 4.8 or 6.4 cm above the phantom. FIG. 8 shows $B_1^+$ efficiency—Simulation ($\mu T/\sqrt{W}$) maps 826, $B_1^+$ efficiency—Experiment ($\mu T/\sqrt{W}$) maps 828, and $B_1^+/\sqrt{10\text{ g SAR}_{peak}}$ ($\mu T/\sqrt{kg/W}$) maps 830 with the non-flipped configuration 802, the flipped configuration 804, and the flipped configuration 806 maintaining the same distance between the dipole antenna and the subject as the non-flipped setup. Table 2 shows the highest point value of (i) the $B_1^+$ efficiency rectangular block shaped antenna apparatus for Simulation ($\mu T/\sqrt{W}$) maps 826, (ii) the $B_1^+$ efficiency—Experiment ($\mu T/\sqrt{W}$) maps 828, and (iii) the $B_1^+/\sqrt{W}/\sqrt{10\text{ g SAR}_{peak}}$ ($\mu T/\sqrt{kg/W}$) maps 830 with the non-flipped configuration 802, the flipped configuration 804, and the flipped configuration 806 maintaining the same distance between the dipole antenna and the subject as the non-flipped setup.

TABLE 2

| Block Shaped HPM | | | |
|---|---|---|---|
| | Normal HPM Dipole | Flipped HPM Dipole | Flipped (Same distance) |
| $B_1^+/\sqrt{W}$ - Simulation ($\mu T/\sqrt{W}$) | 0.67 | 1.06 | 0.79 |
| $B_1^+/\sqrt{W}$ - Experiment ($\mu T/\sqrt{W}$) | 0.41 | 0.58 | 0.51 |
| $B_1^+/\sqrt{W}/\sqrt{10\text{ g SAR}_{peak}}$ ($\mu T/\sqrt{kg/W}$) | 0.27 | 0.29 | 0.27 |

For dipole antennas built on HPM, the highest $B_1^+$ efficiency ($B_1^+/\sqrt{W}$) can be achieved when the antenna side faces the imaging subject and the HPM facing away from the imaging subject (i.e., the flipped configuration). These HPM dipole antenna apparatus (e.g., antenna apparatus 200 shown in FIG. 2) show favorable $B_1^+/\sqrt{W}/\sqrt{10\text{ g SAR}_{peak}}$ compared to other conventional non-flipped configurations and is a more efficient transmitter and receiver.

Figure 9:
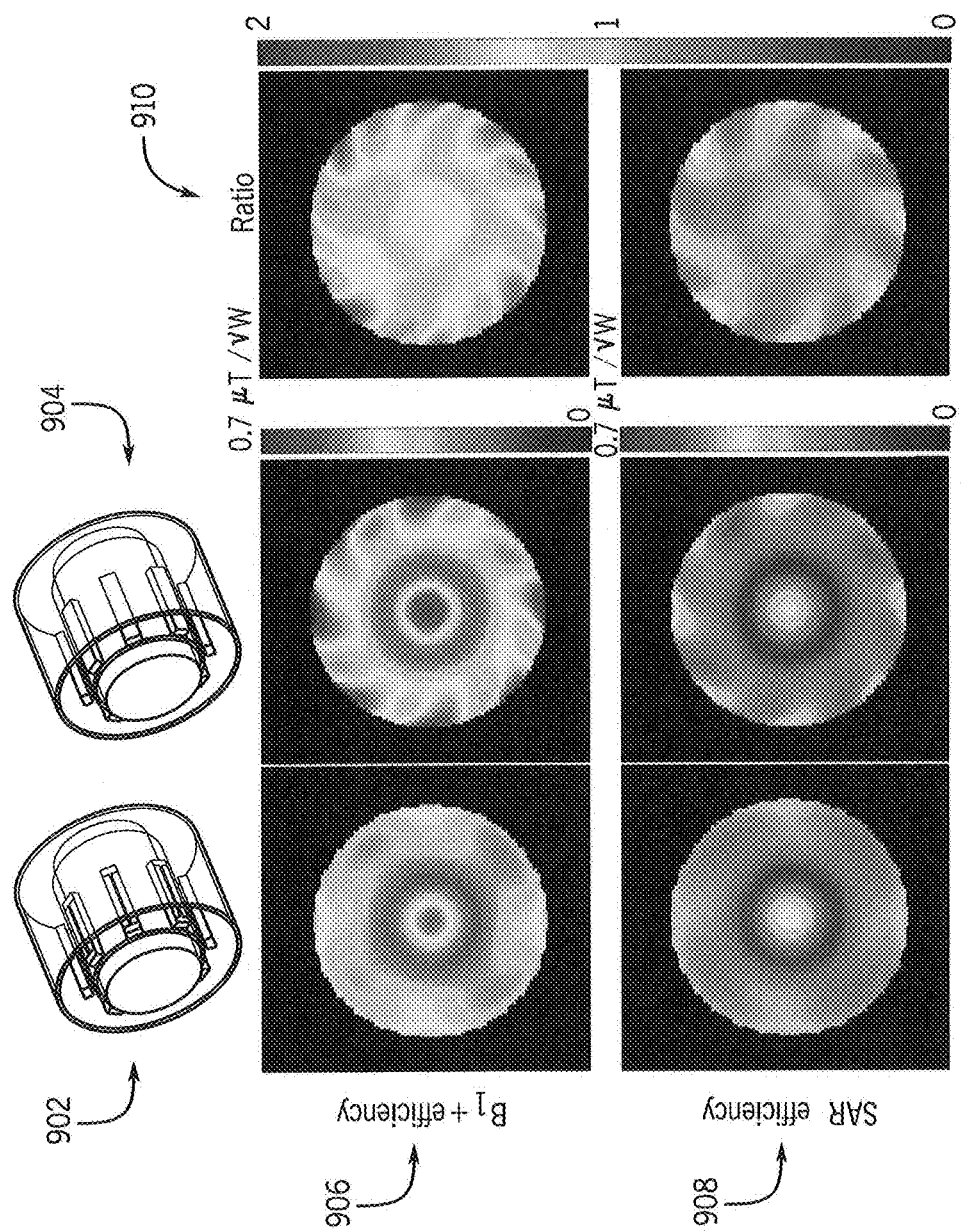
FIG. 9 shows a comparison of $B_1^+$ efficiency and SAR efficiency between an example conventional "non-flipped" configuration and an example "flipped" configuration antenna, both at 10.5T with an end-loaded dipole antenna in accordance with an embodiment.

FIG. 9 shows a comparison of $B_1^+$ efficiency and SAR efficiency between an example conventional "non-flipped" configuration and an example "flipped" configuration antenna, both at 10.5T with an end-loaded dipole antenna. The conventional "non-flipped" configuration 902 is an 8 channel array with a plurality of antennas with HPM where the antennas are end-loaded dipole antennas positioned on the distal surface (relative to the subject) of the HPM. The flipped configuration 904 is an 8 channel array with a plurality of antenna apparatus (e.g., antenna apparatus 200 shown in FIG. 2) where the antennas are end-loaded dipole antennas positioned on a proximal surface (relative to the subject) of the HPM. The $B_1^+$ efficiency (B per square root Watt which is normalized by 1W) and SAR efficiency ($B_1^+$ efficiency per square root peak 10 g SAR) were determined at 10.5T and with a permittivity of the HPM in each configuration of c=100. A comparison of the $B_1^+$ efficiency maps 906, SAR efficiency maps 908 and the ratio 910 between the $B_1^+$ efficiency maps for the two configuration 902, 904 and between the SAR efficiency maps for the two configurations 902, 904 showed improvement for the flipped configuration 904.

Figure 10:
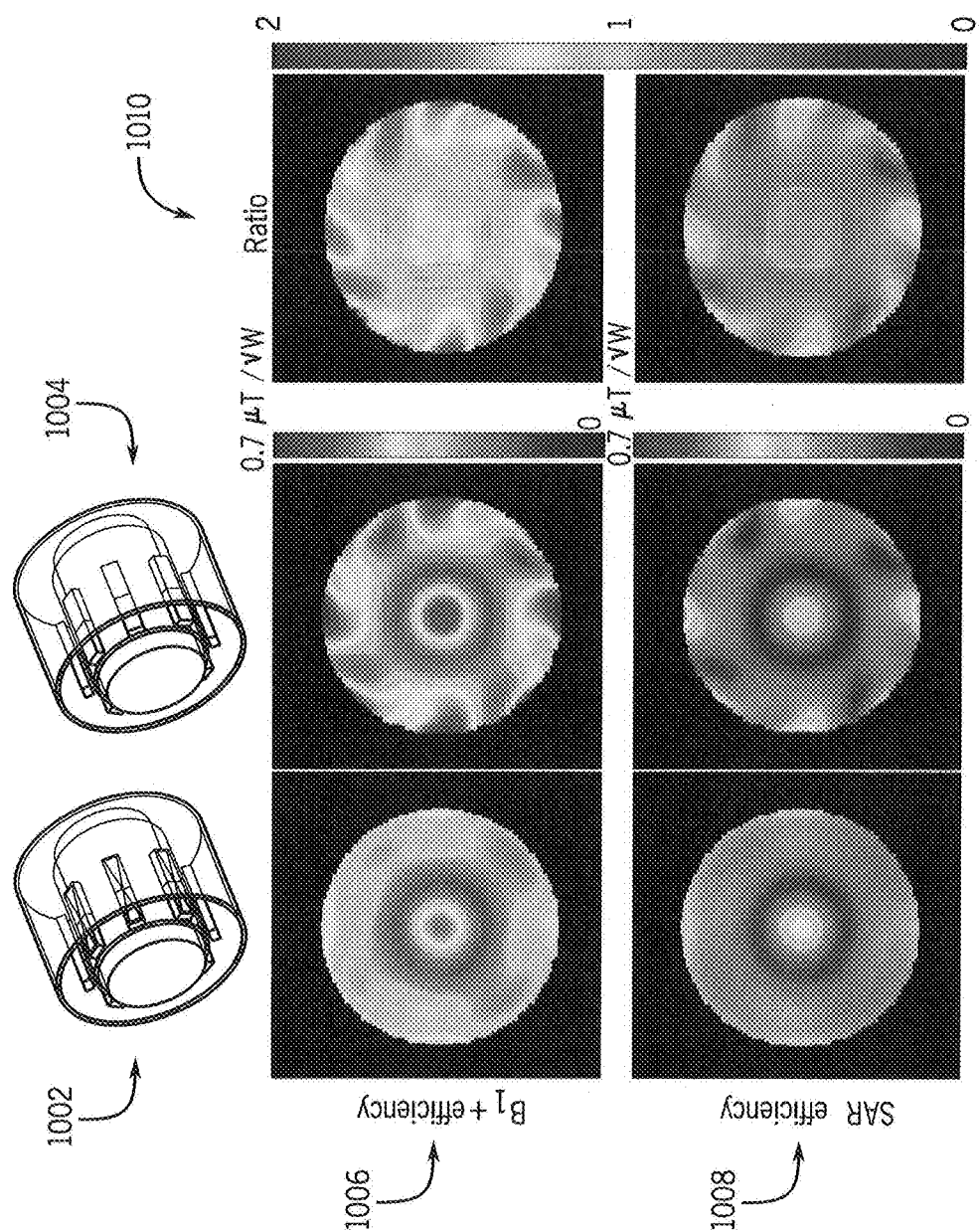
FIG. 10 shows a comparison of $B_1^+$ efficiency and SAR efficiency between an example conventional "non-flipped" configuration and an example "flipped" configuration, both at 10.5T with a "bowtie" antenna in accordance with an embodiment.

FIG. 10 shows a comparison of $B_1^+$ efficiency and SAR efficiency between an example conventional "non-flipped" configuration and an example "flipped" configuration, both at 10.5T with a "bowtie" antenna. The conventional "non-flipped" configuration 1002 is an 8 channel array with a plurality of antennas with HPM where the antennas are "bowtie" antennas positioned on the distal surface (relative to the subject) of the HPM. The flipped configuration 1004 is an 8 channel array with a plurality of antenna apparatus (e.g., antenna apparatus 200 shown in FIG. 2) where the antennas are "bowtie" antennas positioned on a proximal surface (relative to the subject) of the HPM. The $B_1^+$ efficiency and SAR efficiency were determined at 10.5T and with a permittivity of the HPM in each configuration of c=100. FIG. 8 shows $B_1^+$ efficiency maps 1006, SAR efficiency maps 1008 and the ratio 1010 between the $B_1^+$ efficiency maps for the two configuration 1002, 1004 and between the SAR efficiency maps for the two configurations 1002, 1004. A comparison of the ratio between the $B_1^+$ efficiency maps 1006 showed an approximately 60% improvement near the surface and an approximately 20% improvement at the center for the flipped configuration 904. A comparison of the ratio between the SAR efficiency maps showed there is not much improvement in terms of SAR efficiency as shown in a single element.

Figure 11:
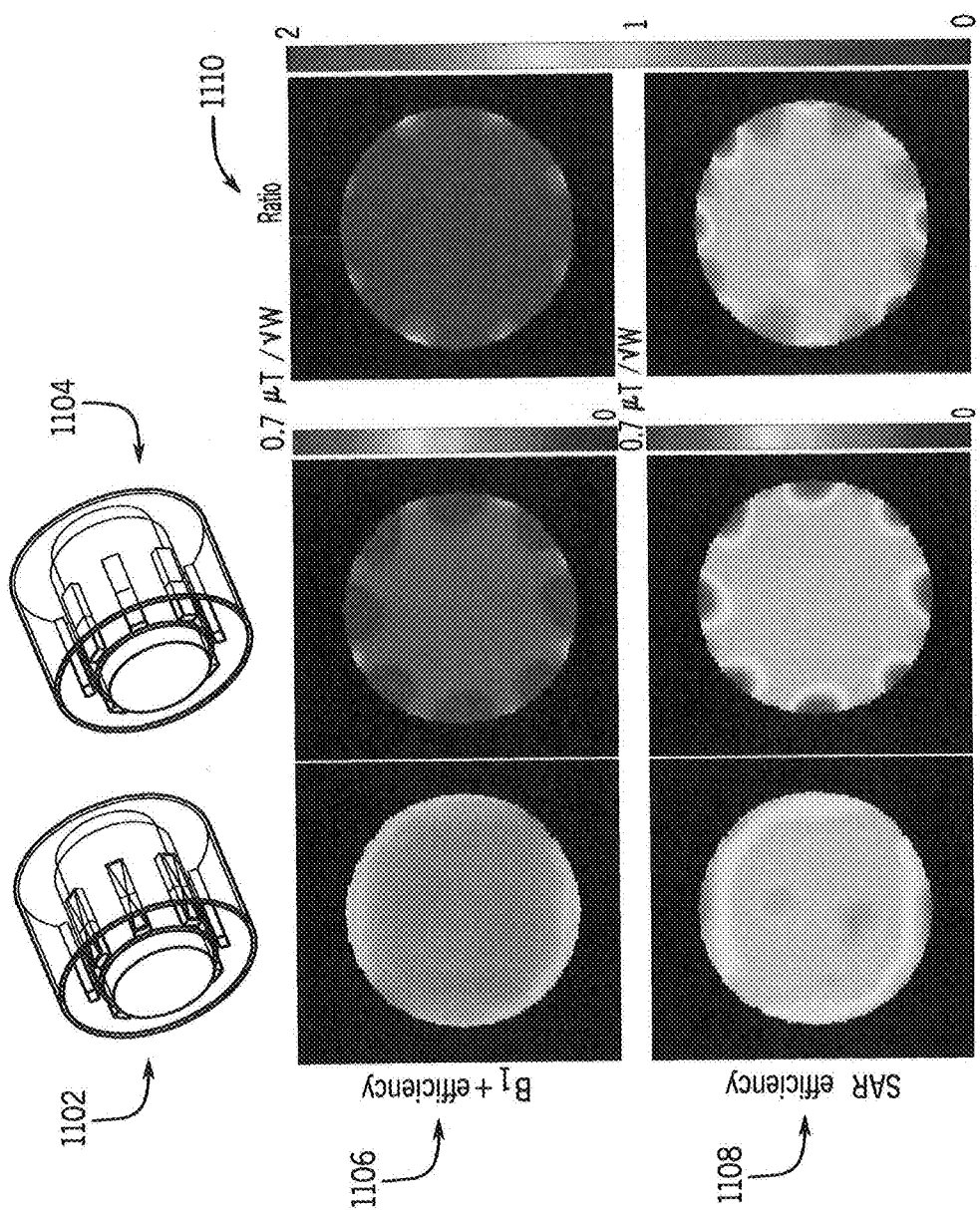
FIG. 11 shows a comparison of $B_1^+$ efficiency and SAR efficiency between an example conventional "non-flipped" configuration and an example "flipped" configuration, both at 3T with a "bowtie" antenna in accordance with an embodiment.

FIG. 11 shows a comparison of $B_1^+$ efficiency and SAR efficiency between an example conventional "non-flipped" configuration and an example "flipped" configuration, both at 3T with a "bowtie" antenna. The conventional "non-flipped" configuration 1102 is an 8 channel array with a plurality of antennas with HPM where the antennas are "bowtie" antennas positioned on the distal surface (relative to the subject) of the HPM. The flipped configuration 1104 is an 8 channel array with a plurality of antenna apparatus (e.g., antenna apparatus 200 shown in FIG. 2) where the antennas are "bowtie" antennas positioned on a proximal surface (relative to the subject) of the HPM. The $B_1^+$ efficiency and SAR efficiency were determined at 3T and with a permittivity of the HPM in each configuration of c=1200. In this example the permittivity value, c=1200, was chosen because it has the equivalent value at 10.5T, which means that c=100 at 10.5T and c=1200 at 3T. FIG. 8 shows $B_1^+$ efficiency maps 1106, SAR efficiency maps 1108 and the ratio 1110 between the $B_1^+$ efficiency maps for the two configuration 1102, 1104 and between the SAR efficiency maps for the two configurations 1102, 1104. Overall, in terms of $B_1^+$ efficiency, the flipped configuration 1104 showed two times more than the conventional non-flipped configuration 1102.

Figure 12:
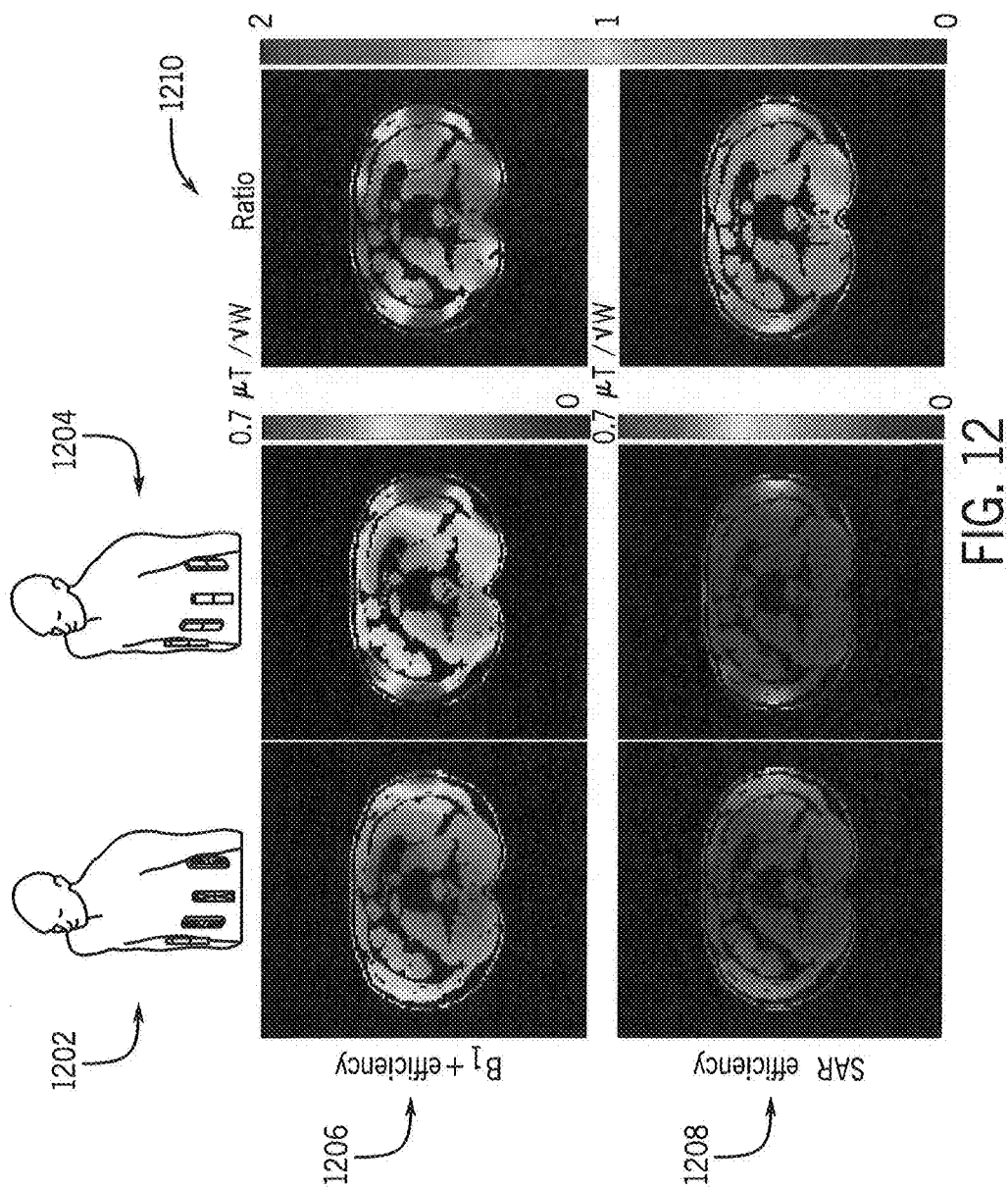
FIG. 12 shows a comparison of $B_1^+$ efficiency and SAR efficiency between an example conventional "non-flipped" configuration and an example "flipped" configuration, both in a body array at 3T with a "bowtie" antenna in accordance with an embodiment.

FIG. 12 shows a comparison of $B_1^+$ efficiency and SAR efficiency between an example conventional "non-flipped" configuration and an example "flipped" configuration, both in a body array at 3T with a "bowtie" antenna. The conventional "non-flipped" configuration 1 202 is an 8 channel body array with a plurality of antennas with HPM where the antennas are "bowtie" antennas positioned on the distal surface (relative to the subject) of the HPM. The flipped configuration 1204 is an 8 channel body array with a plurality of antenna apparatus (e.g., antenna apparatus 200 shown in FIG. 2) where the antennas are "bowtie" antennas positioned on a proximal surface (relative to the subject) of the HPM. The $B_1^+$ efficiency and SAR efficiency were determined at 3T and with a permittivity of the HPM in each configuration of ε=1200. FIG. 8 shows $B_1^+$ efficiency maps 1206, SAR efficiency maps 1208 and the ratio 1210 between the $B_1^+$ efficiency maps for the two configuration 1202, 1204 and between the SAR efficiency maps for the two configurations 1202, 1204. The flipped configuration 1204 shows an improvement in $B_1^+$ efficiency in a body array compared to the conventional non-flipped configuration 1202. Overall, the flipped configuration 1204 showed approximately 70% improvement of $B_1^+$ efficiency and approximately 20% less SAR efficiency than the conventional non-flipped configuration 1202.

Figure 13:
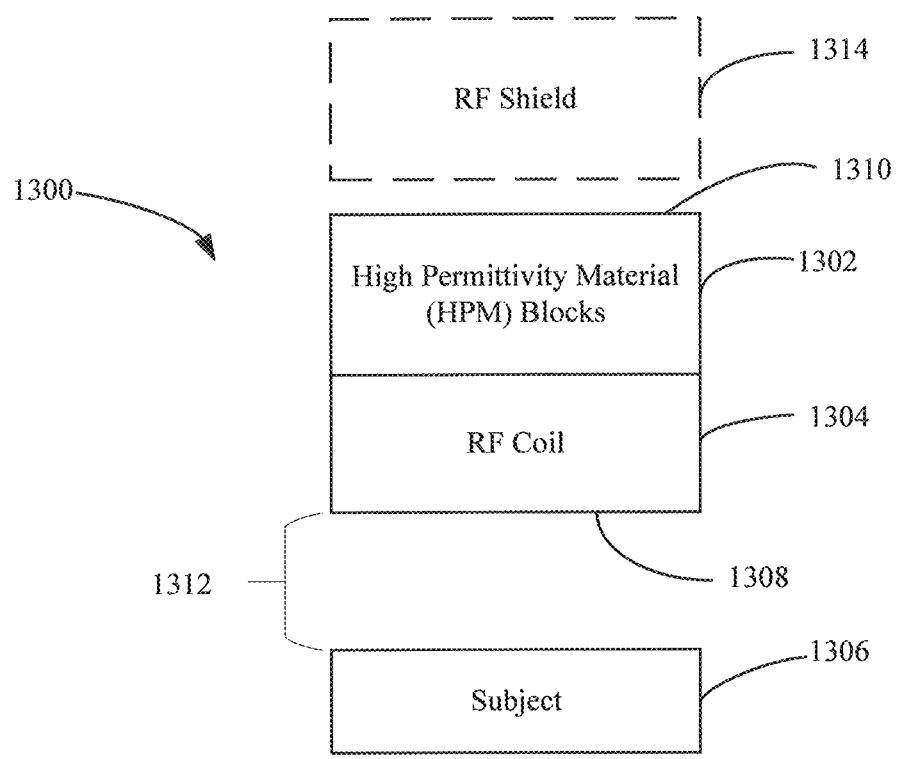
FIG. 13 is a block diagram of an RF coil apparatus in accordance with an embodiment.

In another embodiment, a plurality of high permittivity material (HPM) (or High Dielectric Material or High Dielectric Constant (HDC) Material) blocks may be positioned on a surface of an MR RF coil or transmitter away from (or distal to) the patient, for example, between the RF coil and an RF shield. FIG. 13 is a block diagram of an RF coil apparatus in accordance with an embodiment. In FIG. 13, the RF coil apparatus 600 includes HPM blocks 1302 and an RF coil 1304. The RF coil apparatus 1300 has a proximal surface 608 and a distal surface 1310. The proximal surface 1308 of the RF coil apparatus 1300 is positioned at a distance 1312 from the subject 1306. Each of the HPM blocks 1302 may be formed in a shape, for example, a disk, rectangular blocks, cylinders, etc. The HPM blocks 1302 may be a high permittivity ceramic material, such as, for example, $TiO_2$, $BaTiO_3$, $CaTiO_3$, $BaTi_4O_9$, etc. RF coil 1304 (e.g., RF coil 128 shown in FIG. 1) is a cylindrical coil such as, for example, a birdcage coil or a transverse electromagnetic (TEM) resonator coil. The plurality of HM blocks 1302 are positioned around a circumference of an outer surface of the RF coil 1304. The RF coil apparatus 600 may be used in applications at various field strengths, for example, 1T, 1.5T. 3T and ultra-high fields (UHF) 7T and 10.5T.

The proximal surface 1308 of the RF coil apparatus 1300 is positioned so that the RF coil 1304 is located between the HPM blocks 1302 and a subject 1306 in an imaging volume (e.g., imaging volume 150 shown in FIG. 1) and the HPM block 1302 are positioned between the RF coil 1302 and an RF shield 1314. In other words, the proximal surface 1308 and the RF coil 1304 face the subject 1306 and the distal surface 1310 and the HPM blocks 1302 face away from the subject 1306. The RF shield 1314 is disposed around the HPM blocks 1303 and RF coil 1302. In an embodiment, the RF shield 1324 is incorporated in a gradient coil. In another embodiment, an RF shield 1314 may not be included in the RF coil apparatus, for example, in head or knee applications at 1.5T and 3T. Positioning the RF coil 1304 between the HPM blocks 1302 and the subject 1306 improves the performance of the RF coil apparatus 1300 including $B_1^+$ efficiency and specific absorption rate (SAR) efficiency.

Figure 14:
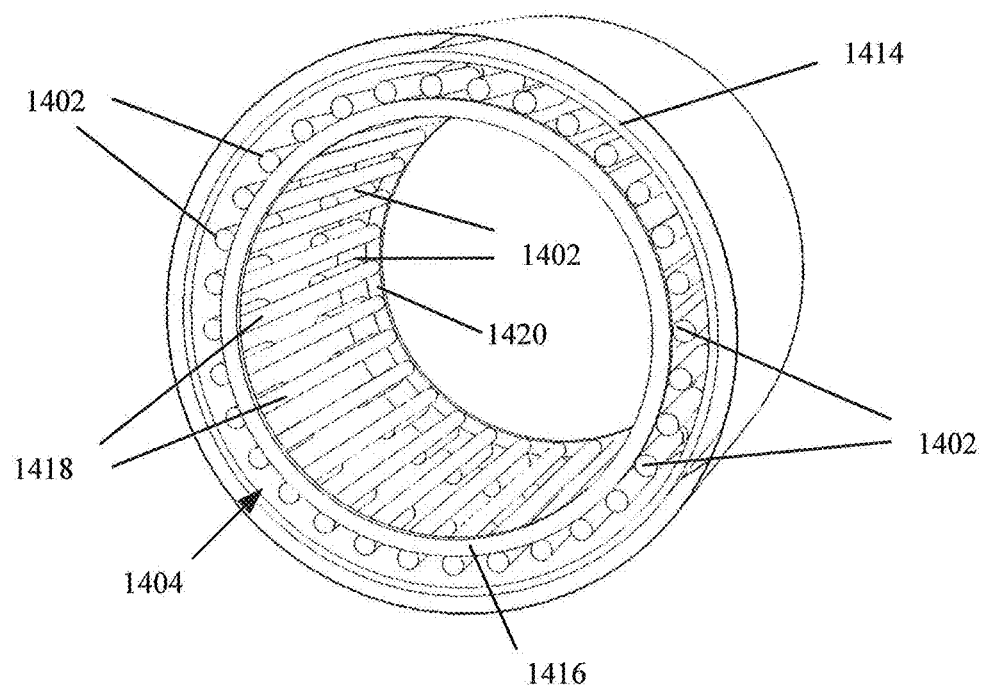
FIG. 14 is a perspective view of an RF coil apparatus in accordance with an embodiment.
Figure 15:
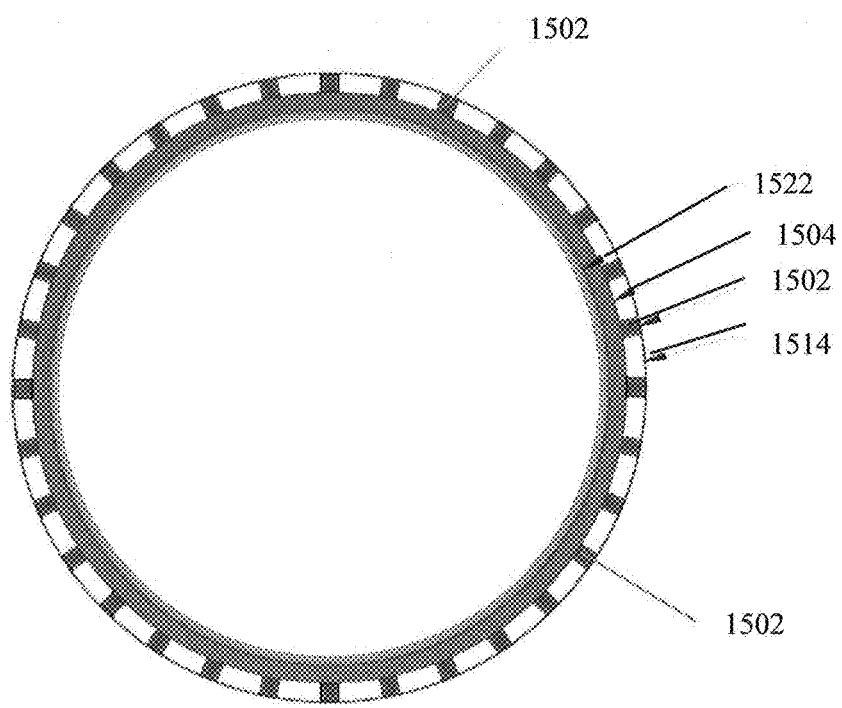
FIG. 15 is an end cross-sectional view of an RF coil apparatus in accordance with an embodiment.

As mentioned, the RF coil 1304 may be a cylindrical birdcage coil. FIG. 14 is a perspective view of an RF coil apparatus in accordance with an embodiment. In FIG. 14, the RF coil 1404 is a birdcage coil and comprises a plurality of rungs (or elements) 1418. Each rung 1418 is connected at a first end to a first end ring 1416 and on an opposite end by a second end ring 1420. While the RF coil 1404 is shown with 32 rungs 1418 (i.e. a 32 element birdcage coil), it should be understood that a greater or lesser number rungs 1418 may be used. A plurality of HPM blocks 1402 are positioned on an outer surface (i.e., away from the subject) of each rung 1418. In FIG. 14, two HPM blocks 1402 are positioned on each rung 1418 and may be spaced apart along the rung 1418 by a distance. In this embodiment, one HPM block placed proximate to the first end ring 1416 and a second HPM block is positioned proximate to the second end ring 1420. In other embodiments, different sizes, orientations and positions of HPM blocks 1402 may be used. While the HPM blocks 1402 in FIG. 14 are cylindrical in shape, it should be understood that the HPM blocks 1402 may be other shapes, for example, rectangles, bars or disks. The shape, size, location and permittivity of the HPM blocks 1402 may be optimized for specific RF coil 1404 designs. An RF shield 1414 is positioned around an outer circumference of the HPM blocks 1402 and RF coil 1404. In an embodiment, the RF shield 1414 is incorporated in a gradient coil (not shown). The HPM blocks 1402 are positioned between the RF coil 1404 and the RF shield 1414. In one embodiment, the HPM blocks 1402 may be in contact with the RF coil 1404 but not the RF shield 1414 (shown in FIG. 14) or in another embodiment (e.g., as shown in FIG. 15), the HPM blocks may be in contact with both the RF coil and the RF shield. FIG. 15 is an end cross-sectional view of an RF coil apparatus in accordance with an embodiment. In FIG. 15, a cylindrical RF birdcage coil 1504 is positioned around an outer circumference of a bore liner 1522. A plurality of rectangular or bar shaped HPM blocks 1504 are positioned on the RF coil 1504 (e.g., on the rungs of a birdcage RF coil) and between the RF coil 1504 and an RF shield 1514.

The present invention has been described in terms of one or more preferred embodiments, and it should be appreciated that many equivalents, alternatives, variations, and modifications, aside from those expressly stated, are possible and within the scope of the invention.

The invention claimed is:

1. An antenna apparatus for a radio frequency (RF) coil to transmit signals to and to receive signal from a subject in an imaging volume of a magnetic resonance imaging (MRI) system, the apparatus comprising:
    a distal surface facing away from the subject;
    a proximal surface facing towards the subject;
    a high permittivity material (HPM) having a shape configured to be smaller than the imaging volume, wherein the shape of the HPM defines a set of dimensions of the proximal surface; and
    a non-cylindrical antenna coupled to the HPM and positioned on the proximal surface such that the antenna is positioned between the HPM and the subject, wherein the non-cylindrical antenna is configured to fit within the set of dimensions of the proximal surface.

2. The antenna apparatus according to claim 1, wherein the antenna is a dipole antenna.

3. The antenna apparatus according to claim 1, wherein the antenna is a bowtie antenna.

4. The antenna apparatus according to claim 1, wherein the HPM is a high permittivity ceramic material.

5. The antenna apparatus according to claim 1, wherein the shape of the HPM is a disk.

6. The antenna apparatus according to claim 5, wherein the HPM is a combination of rectangular blocks.

7. The antenna apparatus according to claim 1, wherein the shape of the HPM is a single rectangular block.

8. The antenna apparatus according to claim 1, wherein the shape of the HPM is a cylinder.

9. The antenna apparatus according to claim 1, wherein the antenna is attached to the HPM.

10. A magnetic resonance imaging (MRI) system comprising:
    a magnet system configured to generate a polarizing magnetic field about at least a portion of a subject in an imaging volume of the MRI system;

a magnetic gradient system including a plurality of magnetic gradient coils configured to apply at least one magnetic gradient field to the polarizing magnetic field; and a radio frequency (RF) system configured to apply an RF field to the subject and to receive magnetic resonance signals from the subject using at least one RF coil, wherein the at least one RF coil includes at least one antenna apparatus comprising:
- a distal surface facing away from the subject;
- a proximal surface facing towards the subject;
- a high permittivity material (HPM) having a shape configured to be smaller than the imaging volume, wherein the shape of the HPM defines a set of dimensions of the proximal surface; and
- a non-cylindrical antenna coupled to the HPM and positioned on the proximal surface such that the antenna is positioned between the HPM and the subject, wherein the non-cylindrical antenna is configured to fit within the set of dimensions of the proximal surface.

11. The system according to claim 10, wherein the antenna is a dipole antenna.

12. The system according to claim 10, wherein the antenna is a bowtie antenna.

13. The system according to claim 10, wherein the HPM is a high permittivity ceramic material.

14. The system according to claim 10, wherein the shape of the HPM is a disk.

15. The system according to claim 10, wherein the shape of the HPM is a rectangular block.

16. The antenna apparatus according to claim 10, wherein the shape of the HPM is a cylinder.

17. The system according to claim 10, wherein the antenna is attached to the HPM.

18. The system according to claim 10, wherein the at least one antenna apparatus includes a plurality of antenna apparatus configured in an array.

19. The system according to claim 18, wherein the array is a body array.

* * * * *